Patent Number: 4,766,392
Date of Patent: Aug. 23, 1988

[54] DEMODULATING AN ANGLE-MODULATED SIGNAL
[75] Inventor: Paul A. Moore, Hove, England
[73] Assignee: U.S. Philips Corporation, New York, N.Y.
[21] Appl. No.: 79,548
[22] Filed: Jul. 29, 1987
[30] Foreign Application Priority Data
Aug. 1, 1986 [GB] United Kingdom ................. 8618855
[51] Int. Cl.⁴ ............................................ H03D 3/00
[52] U.S. Cl. ..................................... 329/124; 329/50; 375/39
[58] Field of Search ................. 329/50, 122, 123, 124, 329/131, 133; 375/39, 99, 102; 455/214, 296, 337; 307/490, 491

[56] References Cited
U.S. PATENT DOCUMENTS
4,713,563 12/1987 Marshall et al. ................ 329/124 X Primary Examiner—Eugene R. LaRoche
Assistant Examiner—Robert J. Pascal
Attorney, Agent, or Firm—Thomas A. Briody; Algy Tamoshunas; Marianne R. Rich

[57] ABSTRACT

A zero-IF receiver for an FM signal comprises quadrature-mixers (2,3) to which the input signal is applied and which mix the received carrier down to zero frequency. The signals appearing at the mixer outputs (11,12) are fed to a differentiate, multiply and subtract demodulator (22,23,25,27,31) via capacitors (17,19) which block the d.c. components of the signals, thereby preventing amplifier saturation effects, etc. This d.c.-blocking would, unless steps were taken to prevent it, result in distortion of the output signal appearing at an output terminal (32). This distortion is prevented by providing an amplitude divider (33) in the output signal path. The signal fed to the divider control input (48) is derived from the output signals of the blocking capacitors by squaring them by means of multipliers (37,40), adding the results together in an adder (43) and applying the adder output signal to the control input (48) both directly and via a low-pass filter (46) the cut-off frequency of which is equal to that of the high-pass filters (15,16) of which the blocking capacitors effectively form part.

5 Claims, 1 Drawing Sheet

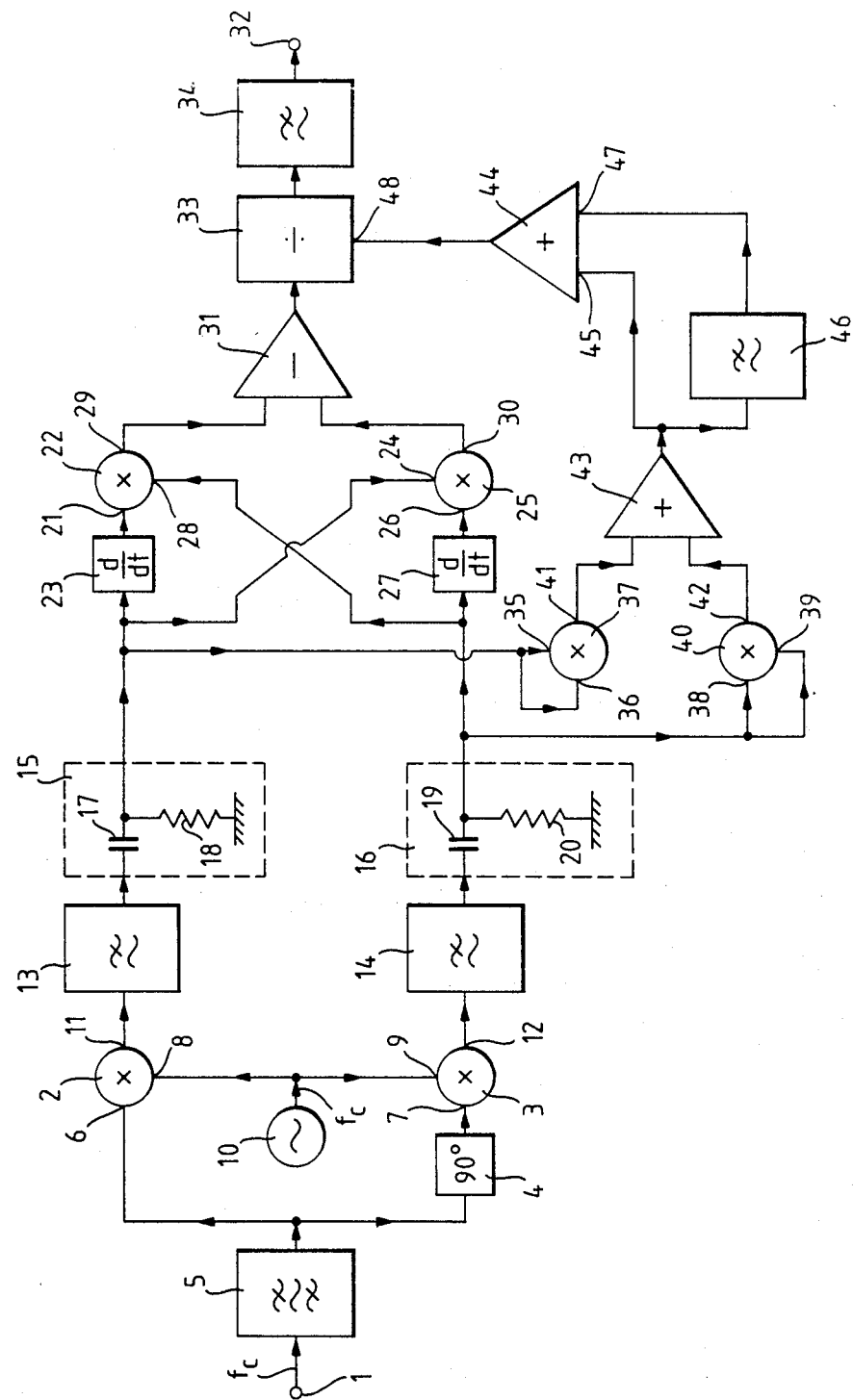

DEMODULATING AN ANGLE-MODULATED SIGNAL

BACKGROUND OF THE INVENTION

This invention relates to a method of demodulating an angle-modulated signal, comprising quardrature-mixing said angle-modulated signal with a local oscillator signal to produce a pair of signals in each of which a frequency within the bandwidth of the angle-modulated signal has been translated to zero, differentiating with respect to time a signal derived from one signal of the pair and multiplying the result by a signal derived from the other signal of the pair to produce a first auxiliary signal, differentiating with respect to time the signal derived from the other signal of the pair and multiplying the result by the signal derived from the one signal of the pair to produce a second auxiliary signal, forming an output signal proportional to the difference between said first and second auxiliary signals, and varying the proportionality factor in dependence upon the sum of the squares of the instantaneous amplitudes of said signals derived from the one and the other signal of the pair. The invention also relates to a demodulator for performing such a method.

A method of the above kind is known from an article by J. K. Goatcher, M. W. Neale and I. A. W. Vance entitled "Noise considerations in an integrated circuit VHF radio receiver" in the Proceedings of the IERE Clerk Maxwell Commemorative Conference on Radio Receivers and Associated Systems (IERE Proceedings No. 50), University of Leeds, 7th–9th July 1981, pages 49–51.

Demodulating an FM signal by quadrature-mixing it with a local oscillator signal to translate a frequency within its bandwidth to zero, differentiating each member of the resulting pair of signals with respect to time and multiplying the result by the other member of the pair, and subtracting the results of the multiplications once from the other to produce an output signal is known from Patent Specification GB-A-1530602. Unfortunately the output signal obtained by means of this basic method has a square-law dependence on the levels of the signals of the pair. Accordingly, in the method known from the above-mentioned article the two signals of the pair are additionally squared, the results added together, and the signal resulting from this addition is fed to the control input of an amplitude divider which operates on the difference between the auxiliary signals.

Receivers in which an FM signal is quadrature-mixed to translate a frequency within its bandwidth to zero suffer from the disadvantage that the resulting d.c. component in each signal of the pair of signals obtained by means of the mixing operation cannot be distinguished from unwanted d.c. offsets which inevitably exist at the output of each mixer. During reception of the smallest detectable signal these offsets are typically 60dB larger than the wanted d.c. components. Moreover, each signal of the pair has to be amplified by, typically, 90dB, without limiting, before it is processed further. This is impracticable, using circuits operating from reasonable supply voltages, unless the d.c. components (both wanted and unwanted) are eliminated by suitable filtering, for example by the insertion of d.c.-blocking series capacitors or equivalent circuitry (see for example co-pending UK Patent Application No. 8512491 (PHB 33174)) in the path for each signal of the pair. The cut-off frequency of such a filter cannot be made arbitrarily small, since, at least in the case of portable or mobile receivers, the d.c. signals being eliminated cannot be regarded as time-invariant. Unfortunately the provision of such filters creates a hole in the effective input passband of the receiver, and this results in distorted recovery of the original modulation by the method described in the aforesaid patent specification GB-A-1530602, and indeed by any other known method. Employing, in addition, the simple square, add and divide mechanism described in the aforesaid article by Goatcher, Neale and Vance is found to make matters subjectively even worse, at least when the modulation is speech.

SUMMARY OF THE INVETIONTION

It is an object of the present invention to enable a considerable improvement to be obtained in this respect.

According to one aspect the invention provides a method of demodulating an angle-modulated signal, comprising quardrature-mixing said angle-modulated signal with a local oscillator signal to produce a pair of signals in each of which a frequency within the bandwidth of the angle-modulated signal has been translated to zero, differentiating with respect to time a signal derived from one signal of the pair and multiplying the result by a signal derived from the other signal of the pair to produce a first auxiliary signal, differentiating with respect to time the signal derived from the other signal of the pair and multiplying the result by the signal derived from the one signal of the pair to produce a second auxiliary signal, forming an output signal proportional to the difference between said first and second auxiliary signals, and varying the proportionality factor in dependence upon the sum of the squares of the instantaneous amplitudes of said signals derived from the one end the other signal of the pair, characterized in that each of the signals derived from the one and the other signal of the pair is a filtered version of the corresponding signal of the pair in which any d.c. component of the corresponding signal of the pair has been removed and in that the proportionality factor is varied in inverse relationship to an additive combination of the squares of said instantaneous amplitudes and a low-pass filtered version of the squares of said instantaneous amplitudes.

It has now been found that the distortion-producing effect of the insertion of d.c.-blocking means between the quadrature mixers of the known demodulator and the differentiating and multiplying means can be very substantially reduced by varying the proportionality factor between the output signal and the difference between the first and second auxiliary signal in inverse relationship to an additive combination of the sum of the squares of the said instantaneous amplitudes and a low-pass filtered version of the sum of the squares of the said instantaneous amplitudes. It is thought that varying the proportionality factor in this way may result in effectively reinserting in the input signals to the differentiating and multiplying means their average values which have been lost by their transmission through the d.c. blocking means, the said low-pass filtered version preferably having a cut-off frequency which is substantially equal to the low-frequency cut-off point of each filtered version of the corresponding signal of the pair.

According to another aspect the invention provides a demodulator for an angle-modulated signal, comprising an input for said signal, a local oscillator, quadrature-related mixing means to inputs of which said input and said local oscillator are coupled, for producing a pair of signals in each of which a frequency within the bandwidth of an angle-modulated signal applied in operation to said input has been translated to zero, differentiating and multiplier means for differentiating with respect to time a signal derived from one signal of the pair and multiplying the result by a signal derived from the other signal of the pair to produce a first auxiliary signal, differentiating and multiplier means for differentiating with respect to time a signal derived from the other signal of the pair and multiplying the result by a signal derived from the one signal of the pair to produce a second auxiliary signal, means for forming an output signal proportional to the difference between said first and second auxiliary signals, and further means for varying the proportionality factor in dependence upon the sum of the squares of the instantaneous amplitudes of said signals derived from the one and the other signal of the pair, characterised in that filter means are provided for forming each of the signals derived from the one and the other signal of the pair as a filtered version of the corresponding signal of the pair in which any d.c. component of the corresponding signal of the pair has been removed, and in that said further means is arranged to vary the proportionality factor in inverse relationship to an additive combination of the squares of said instantaneous amplitudes and a low-pass filtered version of the squares of said instantaneous amplitudes.

BRIEF DESCRIPTION OF THE DRAWING

An embodiment of the invention and some possible modifications thereto will now be described, by way of example, with reference to the accompanying diagrammatic drawing the single FIGURE of which is a diagram of a demodulator for an FM signal.

DESCRIPTION OF THE PREFERRED EMBODIMENT

In the drawing a demodulator for an FM signal of nominal carrier frequency fc received on an input 1, for example an aerial, comprises quadrature related mixing means in the form of a pair of mixers 2 and 3 and a 90 degree phase-shifter 4. The input 1 is coupled, via a band-pass anti-harmonic filter 5 whose pass-band is centered on the frequency fc to a first input 6 of mixer 2 directly and to a first input 7 of mixer 3 via the phase-shifter 4. Second inputs 8 and 9 of the mixers 2 and 3 are fed with the output signal of a local oscillator 10, which generates an output frequency $f_c$, which output signal is non-coherent with the input signal applied to input 1. The resulting frequency-difference signals appearing at the mixer outputs 11 and 12 (in which signals the nominal carrier frequency $f_c$ has been translated to substantially zero) are fed via low-pass adjacent-channel selectivity filters 13 and 14 respectively to d.c.-blocking filters 15 and 16 respectively, which are shown diagrammatically as comprising a series capacitor 17 and a parallel resistor 18, and a series capacitor 19 and a parallel resistor 20, respectively. In practice the filters 15 and 16 (which could alternatively be included in the input signal paths to the filters 13 and 14 respectively) may take the form of series capacitors or their equivalent (see for example the aforesaid copending UK Patent Application No. 8512491) between respective pairs of stages of a cascade combination of amplifier stages (not shown).

The output signal of filter 15 is fed to a first input 21 of a multiplier stage 22 via a differentiating circuit 23, and to a second input 24 of a multiplier stage 25 directly. Similarly, the output signal of filter 16 is fed to a first input 26 of the multiplier stage 25 via a differentiating circuit 27 and to a second input 28 of the multiplier stage 22 directly. The differentiating circuits may be, for example, simple series-capacitor parallel-resistor circuits having time-constants shorter than the reciprocal of the highest frequency expected at the outputs of the filters 15 and 16, or more complicated circuits, for example active differentiating circuits, having the same property. The signals appearing at the outputs 29 and 30 of the multiplier stages 22 and 25 are subtracted one from the other in a subtractor 31, for example an amplifier having inverting and non-inverting inputs, and the resulting difference signal is applied to an output terminal 32 via an amplitude divider or controllable gain stage 33, for example of the kind obtainable from Analog Devices Inc. under the type number AD535, and a low-pass post-filter 34. The signal appearing at output 32 is a demodulated version of the input signal applied to input 1.

The output signals of the filters 15 and 16 are also applied to both inputs 35 and 36 of a multiplier 37 and both inputs 38 and 39 of a multiplier 40, respectively. Multipliers 37 and 40 therefore produce at their outputs 41 and 42 signals representative of the squares of the instantaneous amplitudes of the output signals of filters 15 and 16 respectively. These squared signals are added together in a signal adder 43 and the result is fed to a further signal adder 44, both directly to an input 45 thereof and also via a low-pass filter 46 to another input 47 thereof. The output of adder 44 is fed to the division factor control input 48 of the amplitude divider 33. The proportionality factor between the signal fed to the output terminal 32 and the output signal of signal subtractor or differencer 31 is thus made to vary inversely with the sum of the squares of the instantaneous amplitudes of the signals appearing at the outputs of the filters 15 and 16 and a low-pass filtered or averaged version of the sum of the squares of said instantaneous amplitudes, the low-pass filtering being carried out by means of filter 46 the cut-off frequency of which is preferably substantially equal to the low-frequency cut-off points of the filters 15 and 16.

If filters 15 and 16 were replaced by direct connections and filter 46 were replaced by an open circuit, the circuit shown would correspond with that described in the article by Goatcher, Neale and Vance, with all the problems of coping with d.c. components in the signal paths from filters 13 and 14 to the components 22, 23, 25 and 27 that that would entail. However, as pointed out above, mere inclusion of the filters 15 and 16 to overcome these problems would result in considerable distortion of the signal appearing at output 32. It has surprisingly been found that inclusion, in addition, of filter 46 results in this distortion being reduced to a very low level, indeed a level considerably below that which would be obtained if the feed-forward loop comprising the components 33, 37, 40, 43, 44 and 46 were omitted completely.

It will be appreciated that many modifications are possible to the circuit shown. For example the amplitude divider 33 in the output signal path from differencer 31 may be replaced by a respective similarly-controlled amplitude divider in the output signal path from multiplier 22 and the output signal path from multipler 25. As another example it is not essential to provide two parallel signal paths from the output of adder 43 to the control input 48 of divider 33. All that is required is that the transmission of the path from adder 43 to control input 48 should correspond to that given by the parallel path arrangement shown, i.e. at relatively low frequencies be double what it is at relatively high frequencies; such a transmission characteristic could be obtained by means of a single filter without a path circumventing it (or by a respective such filter having the same characteristics at the output of each multiplier 37 and 40, the components 44–47 being replaced by a direct connection from the output of adder 43 to control input 48 in this case). The actual gain or loss in this filter is, in principle, immaterial. As yet another example the take-off points to the multipliers 37 and 40 from the signal channels to the components 22, 23, 25, 27 could be moved further back along these channels towards the signal input 1, provided that duplicates of those components in the two channels which are no longer present in the input paths to the multipliers are then themselves provided in the input paths to the multipliers. As is known, the phase-shifter 4 may be provided instead in the signal path from local oscillator 10 to either the input 8 of mixer 2 or the input 9 of mixer 3.

Although a hard-wired analog circuit has been described it will be evident that some or all of the functions performed thereby may be carried out by means of digital components such as digital filters and/or a suitably programmed microcomputer, provided that the relevant signals are first converted to digital form. Thus, for example, the functions performed by the arrangement comprising the components 22, 23, 25, 27, 31, 33, 37, 40, 43, 46 and 44 may be performed by a suitably programmed microcomputer.

In a practical example a circuit of the kind described had an effective input bandwidth of 15 kHz and an input signal had 3 kHz peak deviation. The cut-off frequency of the filters 15 and 16 was 500 Hz, as was the cut-off frequency of filter 46. Filter 46 was a simple first-order filter. In spite of the high cut-off frequency of the filters 15 and 16 the output signal at output 32 was found to contain very little distortion indeed. Obviously the cut-off frequencies of the filters 15 and 16 must not be so high that the signal frequencies applied to these filters never exceed them.

Although in the embodiment described the output frequency of oscillator 10 is equal to the nominal carrier frequency $f_c$ of the FM input signal, this is not essential. The demodulator may alternatively be of the so-called "offset" type in which the oscillator output frequency is different from $f_c$ but still equal to a frequency within the bandwidth of the input signal, so that this latter frequency in the input signal is translated to zero by means of the mixers 2 and 3.

It will be evident that by simply providing an integrator at the output 32 the demodulator described may be made suitable for demodulating a phase rather than frequency modulated input signal if desired.

I claim:

1. A method of demodulating an angle-modulated signal, comprising quardrature-mixing said angle-modulated signal with a local oscillator signal to produce a pair of signals in each of which a frequency within the bandwidth of the angle-modulated signal has been translated to zero, differentiating with respect to time a signal derived from one signal of the pair and multiplying the result by a signal derived from the other signal of the pair to produce a first auxiliary signal, differentiating with respect to time the signal derived from the other signal of the pair and multiplying the result by the signal derived from the one signal of the pair to produce a second auxiliary signal, forming an output signal proportional to the difference between said first and second auxiliary signals, and varying the proportionality factor in dependence upon the sum of the squares of the instantaneous amplitudes of said signals derived from the one and the other signal of the pair, characterized in that each of the signals derived from the one and the other signal of tie pair is a filtered version of the corresponding signal of the pair in which any d.c. component of the corresponding signal of the pair has been removed and in that the proportionality factor is varied in inverse relationship to an additive combination of the squares of said instantaneous amplitudes and a low-pass filtered version of the squares of said instantaneous amplitudes.

2. A method as claimed in claim 1, wherein said low-pass filtered version has a cut-off frequency which is substantially equal to the low-frequency cut-off point of each said filtered version of the corresponding signal of the pair.

3. A demodulator for an angle-modulated signal, comprising an input for said signal, a local oscillator, quadrature-related mixing means to inputs of which said input and said local oscillator are coupled, for producing a pair of signals in each of which a frequency within the bandwidth of an angle-modulated signal applied in operation to said input has been translated to zero, differentiating and multiplier means for differentiating with respect to time a signal derived from one signal of the pair and multiplying the result by a signal derived from the other signal of the pair to produce a first auxiliary signal, differentiating and multiplier means for differentiating with respect to time a signal derived from the other signal of the pair and multiplying the result by a signal derived from the one signal of the pair to produce a second auxiliary signal, means for forming an output signal proportional to the difference between said first and second auxiliary signals, and further means for varying the proportionality factor in dependence upon the sum of the squares of the instantaneous amplitudes of said signals derived from the one and the other signal of the pair, characterized in that filter means are provided for forming each of the signals derived from the one and the other signal of the pair as a filtered version of the corresponding signal of the pair in which any d.c. component of the corresponding signal of the pair has been removed, and in that said further means is arranged to vary the proportionality factor in inverse relationship to an additive combination of the squares of said instantaneous amplitudes and a low-pass filtered version of the squares of said instantaneous amplitudes.

4. A demodulator as claimed in claim 3, wherein said further means comprises low-pass filter means, adder means to a first input of which the output of the low-pass filter means is coupled, means for applying a signal proportional to said sum of the squares to both the input of the low-pass filter means and to a second input of the adder means, and amplitude divider means for varying the amplitude of said output signal in inverse proportion to the output signal of said adder means.

5. A demodulator as claimed in claim 4, wherein the cut-off frequency of the low-pass filter means is substantially equal to the low-frequency cut-off point of the filter means.

* * * * *